United States Patent
Suzuki et al.

(10) Patent No.: US 7,953,505 B2
(45) Date of Patent: May 31, 2011

(54) DIGITAL FILTER DEVICE

(75) Inventors: Yasuyuki Suzuki, Hiratsuka (JP);
Shinichi Nakamura, Sagamihara (JP);
Hiroshi Satoh, Isehara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 897 days.

(21) Appl. No.: 11/872,289

(22) Filed: Oct. 15, 2007

(65) Prior Publication Data
US 2008/0097634 A1 Apr. 24, 2008

(30) Foreign Application Priority Data
Oct. 16, 2006 (JP) ................................ 2006-281503

(51) Int. Cl.
*G06F 17/00* (2006.01)
(52) U.S. Cl. ......................................... 700/94
(58) Field of Classification Search .................... 700/94; 381/94.1, 94.2, 94.3, 94.8, 98–109
See application file for complete search history.

(56) References Cited

U.S. PATENT DOCUMENTS
5,808,575 A * 9/1998 Himeno et al. ................ 341/139

FOREIGN PATENT DOCUMENTS
JP 09-130245 5/1997

* cited by examiner

*Primary Examiner* — Andrew C Flanders
(74) *Attorney, Agent, or Firm* — Turocy & Watson, LLP

(57) ABSTRACT

A digital filter device that filters a digital sound signal input to an input terminal and outputs an output digital signal from an output terminal, has a peak value controlling circuit compares a first gain multiplier value and a second gain multiplier value with each other, and replaces a filter coefficients stored in a first coefficient register with a new filter coefficients stored in a second coefficient register at a timing when the gain multiplier value applied to a gain multiplier becomes zero or becomes closest to zero for the first time during shifting the gain multiplier value from a first gain multiplier value to a second gain multiplier value if said first gain multiplier value and said second gain multiplier value are different in sign.

10 Claims, 4 Drawing Sheets

DIGITAL FILTER DEVICE

CROSS-REFERENCE TO RELATED APPLICATION

This application is based upon and claims the benefit of priority from the prior Japanese Patent Application No. 2006-281503, filed on Oct. 16, 2006, the entire contents of which are incorporated herein by reference.

BACKGROUND OF THE INVENTION

1. Field of the Invention

The present invention relates to a digital filter device capable of changing the gain.

2. Background Art

Conventionally, a digital filter is applied to an equalizer or the like. If a digital sound signal passes through the equalizer, the digital sound signal is subjected to an arithmetic operation according to a filter characteristic determined by a filter coefficient of the digital filter.

In order to change a filter characteristic, a filter coefficient has to be changed. When changing the filter coefficient, depending on the level of the digital sound signal or the level of change of the gain, a sharp noise, such as pop noise or step noise, can appear in the output digital sound signal.

According to a conventional technique for reducing such noise, for example, a filter coefficient corresponding to a parameter that determines the frequency characteristic of the filter is reduced, thereby reducing the noise.

However, data is changed while performing the normal arithmetic operation on the input digital sound signal, and therefore, it is difficult to prevent noise from occurring at the point of change. In addition, for a system in which the data is changed within a wide range, a storage region capable of storing an enormous amount of data is wastefully needed.

According to another conventional technique, there is proposed a gain changing circuit that is triggered to change the gain of a digital sound signal when a waveform of an analog sound signal becomes the zero level. This gain changing circuit prevents noise from occurring when changing the gain characteristic of the output signal (refer to Japanese Patent Laid-Open Publication No. 9-130245, for example).

However, this conventional technique cannot compensate for a change of a filter characteristic that occurs when changing the gain characteristic of the output signal.

SUMMARY OF THE INVENTION

According to one aspect of the present invention, there is provided: a digital filter device that filters a digital sound signal input to an input terminal and outputs an output digital signal from an output terminal, comprising a first gain register that stores a first gain multiplier value set for adjusting a gain characteristic of said output digital signal;

a first coefficient register that stores a plurality of filter coefficients set for said gain multiplier value;

an IIR digital filter that has at least a first adder that performs an arithmetic operation on signals and outputs the sum, a first multiplier that multiplies said digital sound signal input via said input terminal by a coefficient corresponding to a filter coefficient stored in said first coefficient register and outputs the product to said first adder, a first delay circuit that delays said digital sound signal input via said input terminal and outputs the delayed signal, a second multiplier that multiplies the signal output from said first delay circuit by a coefficient corresponding to a filter coefficient stored in said first coefficient register and outputs the product to said first adder, a second delay circuit that delays the output signal of the first adder and outputs the delayed signal, and a third multiplier that multiplies the signal output from said second delay circuit by a coefficient corresponding to a filter coefficient stored in said first coefficient register and outputs the product to said first adder;

a gain multiplier that multiples the signal output from said first adder by a gain multiplier value;

a second adder that adds said digital sound signal and the signal output from said gain multiplier and outputs the sum to said output terminal;

a second gain register that stores a newly set second gain multiplier value;

a second coefficient register that stores a plurality of new filter coefficients set for said second gain multiplier value; and a peak value controlling circuit that controls said first coefficient register and said second coefficient register and adjusts a peak value of said output digital signal by shifting said gain multiplier value applied to said gain multiplier from said first gain multiplier value to said second gain multiplier value, wherein said peak value controlling circuit compares said first gain multiplier value and said second gain multiplier value with each other, and replaces said filter coefficients stored in said first coefficient register with said new filter coefficients stored in said second coefficient register at a timing when the gain multiplier value applied to said gain multiplier becomes zero or becomes closest to zero for the first time during shifting the gain multiplier value from said first gain multiplier value to said second gain multiplier value if said first gain multiplier value and said second gain multiplier value are different in sign.

According to the other aspect of the present invention, there is provided: a digital filter device that filters a digital sound signal input to an input terminal and outputs an output digital signal from an output terminal, comprising a first gain register that stores a first gain multiplier value set for adjusting a gain characteristic of said output digital signal;

a first coefficient register that stores a plurality of filter coefficients set for said gain multiplier value;

an FIR digital filter that has at least a first adder that performs an arithmetic operation on signals and outputs the sum, a first multiplier that multiplies said digital sound signal via said input terminal by a coefficient corresponding to a filter coefficient stored in said first coefficient register and outputs the product to said first adder, a first delay circuit that delays said digital sound signal input via said input terminal and outputs the delayed signal, and a second multiplier that multiplies the signal output from said first delay circuit by a coefficient corresponding to a filter coefficient stored in said first coefficient register and outputs the product to said first adder;

a gain multiplier that multiples the signal output from said first adder by a gain multiplier value;

a second adder that adds said digital sound signal and the signal output from said gain multiplier and outputs the sum to said output terminal;

a second gain register that stores a newly set second gain multiplier value;

a second coefficient register that stores a plurality of new filter coefficients set for said second gain multiplier value; and a peak value controlling circuit that controls said first coefficient register and said second coefficient register and adjusts a peak value of said output digital signal by shifting said gain multiplier value applied to said gain multiplier from said first gain multiplier value to said second gain multiplier value, wherein said peak value controlling circuit compares said first gain multiplier value and said second gain multiplier value with each other, and replaces said filter coefficients stored in said first coefficient register with said new filter coefficients stored in said second coefficient register at a timing when the gain multiplier value applied to said gain multiplier becomes zero or becomes closest to zero for the first time during shifting the gain multiplier value from said first gain multiplier value to said second gain multiplier value if said first gain multiplier value and said second gain multiplier value are different in sign.

DETAILED DESCRIPTION

In the following, embodiments of the present invention will be described with reference to the drawings.

First Embodiment

Figure 1:
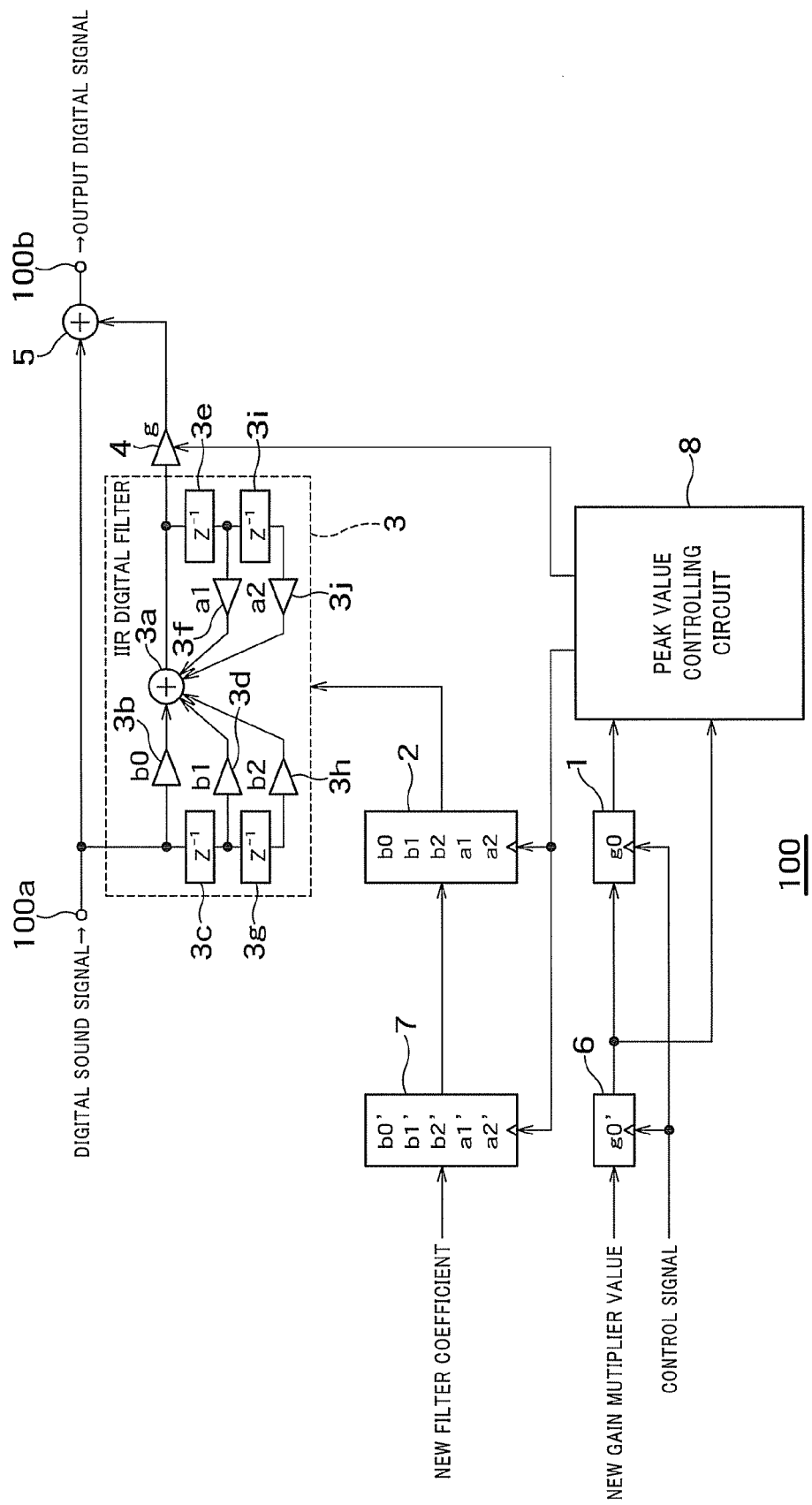
FIG. 1 is a block diagram showing a configuration of essential elements of a digital filter device 100 according to a first embodiment of the present invention, which is an aspect of the present invention.

FIG. 1 is a block diagram showing a configuration of essential elements of a digital filter device 100 according to a first embodiment of the present invention, which is an aspect of the present invention.

As shown in FIG. 1, the digital filter device 100 filters a digital sound signal input to an input terminal 100a and outputs an output digital signal from an output terminal 100b.

The digital filter device 100 has a first gain register 1 that stores a first gain multiplier value "g0" set for adjusting a gain characteristic of the output digital signal and a first coefficient register 2 that stores a plurality of filter coefficients "a1", "a2", "b0", "b1" and "b2" set for the gain multiplier value.

The digital filter device 100 further has an infinite impulse response (IIR) digital filter 3 that filters the digital sound signal.

The IIR digital filter 3 has a first adder 3a that performs an arithmetic operation on signals and outputs the sum, a first multiplier 3b that multiplies the digital sound signal input via the input terminal 100a by a coefficient "b0" corresponding to the filter coefficient "b0" stored in the first coefficient register 2 and outputs the product to the first adder 3a, and a first delay circuit 3c that delays the digital sound signal input via the input terminal 100a and outputs the delayed signal.

The IIR digital filter 3 further has a second multiplier 3d that multiplies the signal output from the first delay circuit 3c by a coefficient "b1" corresponding to the filter coefficient "b1" stored in the first coefficient register 2 and outputs the product to the first adder 3a, a second delay circuit 3e that delays the output signal of the first adder 3a and outputs the delayed signal, and a third multiplier 3f that multiplies the signal output from the second delay circuit 3e by a coefficient "a1" corresponding to the filter coefficient "a1" stored in the first coefficient register 2 and outputs the product to the first adder 3a.

The IIR digital filter 3 further has a third delay circuit 3g that delays the signal output from the first delay circuit 3c and outputs the delayed signal, and a fourth multiplier 3h that multiplies the signal output from the third delay circuit 3g by a coefficient "b2" corresponding to the filter coefficient "b2" stored in the first coefficient register 2 and outputs the product to the first adder 3a.

The IIR digital filter 3 further has a fourth delay circuit 3i that delays the signal output from the second delay circuit 3e and outputs the delayed signal, and a fifth multiplier 3j that multiplies the signal output from the fourth delay circuit 3i by a coefficient "a2" corresponding to the filter coefficient "a2" stored in the first coefficient register 2 and outputs the product to the first adder 3a.

In this way, the IIR digital filter 3 has a second order configuration.

The digital filter device 100 further has a gain multiplier 4 that multiplies the signal output from the first adder 3a by a gain multiplier value and a second adder 5 that adds the digital sound signal and the signal output from the gain multiplier 4 to each other and outputs the sum to the output terminal 100b as the output digital signal.

The digital filter device 100 further has a second gain register 6 that stores a newly set second gain multiplier value "g0'", and a second coefficient register 7 that stores a plurality of new filter coefficients "a1'", "a2'", "b0'", "b1'" and "b2'" set for the second gain multiplier value "g0'".

The digital filter device 100 further has a peak value controlling circuit 8 that controls the first coefficient register 2 and the second coefficient register 7 and adjusts the peak value of the output digital signal by shifting a gain multiplier value "g" applied to the gain multiplier 4 from the first gain multiplier value "g0" to the second gain multiplier value "g0'".

The filter coefficients described above are calculated based on a parameter determined according to the range of change of the frequency characteristic of the IIR digital filter 3.

Alternatively, the filter coefficients (a1, a2, b0, b1, b2) and (a1', a2', b0', b1', b2') may be selected so that the IIR digital filter 3 functions as a peaking filter.

Alternatively, the filter coefficients (a1, a2, b0, b1, b2) and (a1', a2', b0', b1', b2') may be selected so that the IIR digital filter 3 functions as a notch filter.

Alternatively, the filter coefficients (a1, a2, b0, b1, b2) and (a1', a2', b0', b1', b2') may be selected so that the IIR digital filter 3 functions as a shelving filter.

The filter coefficients are determined from parameters of the filter characteristic including frequency, gain and Q value (shoulder characteristic of the filter).

Now, an operation of the digital filter device 100 configured as described above will be described.

In an initial state, the first gain multiplier value "g0" is stored in the first gain register 1, and the filter coefficients "a1", "a2", "b0", "b1" and "b2" are stored in the first coefficient register 2.

First, when the second gain multiplier value "g0'" is stored in the second gain register 6 in response to a control signal, the peak value controlling circuit 8 compares the second gain multiplier value "g0'" with the first gain multiplier value "g0".

If the first gain multiplier value "g0" and the second gain multiplier value "g0'" are different in sign, the peak value controlling circuit 8 detects the timing when the gain multiplier value "g" applied to the gain multiplier 4 becomes zero, or becomes closest to zero for the first time, during shifting from the first gain multiplier value "g0" to the second gain multiplier value "g0'".

Then, the peak value controlling circuit 8 controls the first coefficient register 2 and the second coefficient register 7 and replaces the filter coefficients "a1", "a2", "b0", "b1" and "b2" stored in the first coefficient register 2 with the new filter coefficients "a1'", "a2'", "b0'", "b1'" and "b2'" stored in the second coefficient register 7 at the timing when the gain multiplier value becomes zero or becomes closest to zero for the first time.

The new filter coefficients "a1'", "a2'", "b0'", "b1'" and "b2'" are stored in the second coefficient register 7 at an arbitrary point in time. For example, the new filter coefficients are stored in the second coefficient register 7 when the filter coefficients are calculated based on a parameter associated with the intended new filter characteristic.

If the first gain multiplier value "g0" and the second gain multiplier value "g0'" have the same sign, the peak value controlling circuit 8 determines which of the first gain multiplier value "g0" and the second gain multiplier value "g0'" is closer to zero.

Then, the peak value controlling circuit 8 replaces the filter coefficients "a1", "a2", "b0", "b1" and "b2" stored in the first coefficient register 2 with the new filter coefficients "a1'", "a2'", "b0'", "b1'" and "b2'" stored in the second coefficient register 7 at the timing when one of the first gain multiplier value "g0" and the second gain multiplier value "g0'" that is closer to zero is applied to the gain multiplier 4.

Since the filter coefficient of the IIR digital filter 3 is changed when the gain multiplier value is equal to or close to zero as described above, noise that can occur when the filter coefficient is changed can be reduced.

As a result, for example, the digital sound signal does not need to be muted, so that the frequency level or the sound level can be changed while checking the output characteristic.

Now, there will be described a relationship between the output characteristic and the Q value of the digital filter device 100 in the case where the gain multiplier value is changed.

Figure 2:
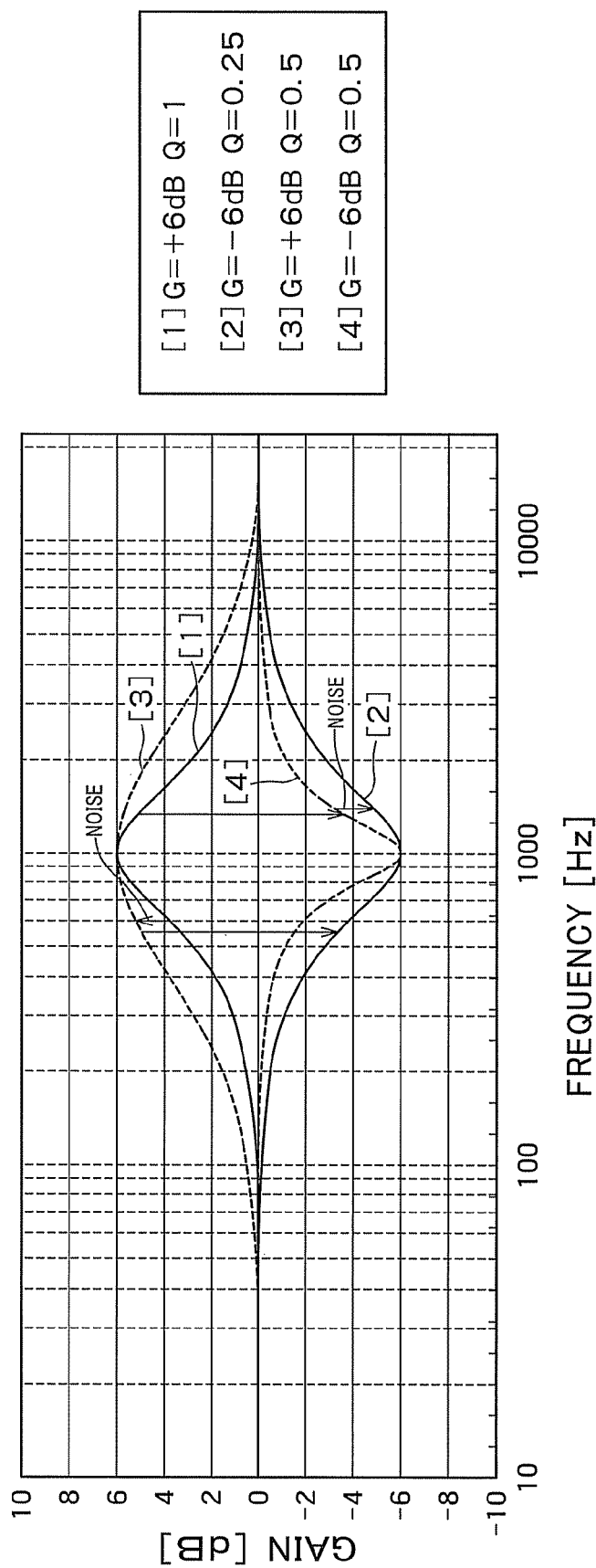
FIG. 2 shows, for illustrative purpose, output characteristics of an output digital signal of a digital filter device in the case where only the sign of the gain multiplier value is changed first, and then the Q value is changed.

FIG. 2 shows, for illustrative purpose, output characteristics of an output digital signal of a digital filter device in the case where only the sign of the gain multiplier value is changed first, and then the Q value is changed.

As shown in FIG. 2, for example, if the Q value, which is determined by the gain multiplier value and the filter coefficients, is set at 1, and only the gain multiplier value is changed from a positive value to a negative value so that a gain "G" at a point frequency of an output characteristic is changed from +6 dB to −6 dB (the gain multiplier value is changed from [1] to [4]), the peak of the output characteristic [4] is more acute than that of the output characteristic [1].

Thus, the output characteristic [4] is made to be approximately symmetrical to the output characteristic [1] with respect to the axis of 0 dB by adjusting the Q value (that is, by adjusting the filter coefficients). In this process, noise occurs as indicated by an arrow.

Similarly, for example, if the Q value is set at 0.5, and only the gain multiplier value is changed from a positive value to a negative value so that a gain "G" at a point frequency of an output characteristic is changed from +6 dB to −6 dB (the gain multiplier value is changed from [3] to [2]), the peak of the output characteristic [2] is more acute than that of the output characteristic [3].

Thus, similarly, the output characteristic [2] is made to be approximately symmetrical to the output characteristic [3] with respect to the axis of 0 dB by adjusting the Q value (that is, by adjusting the filter coefficients). In this process, noise occurs as indicated by an arrow.

In this way, if the sign of the gain multiplier value is changed in an arbitrary manner, the Q value (that is, the filter coefficients) has to be adjusted after that to make the output characteristic approximately symmetrical to the original output characteristic with respect to the axis of 0 dB, and noise occurs in this process.

Figure 3:
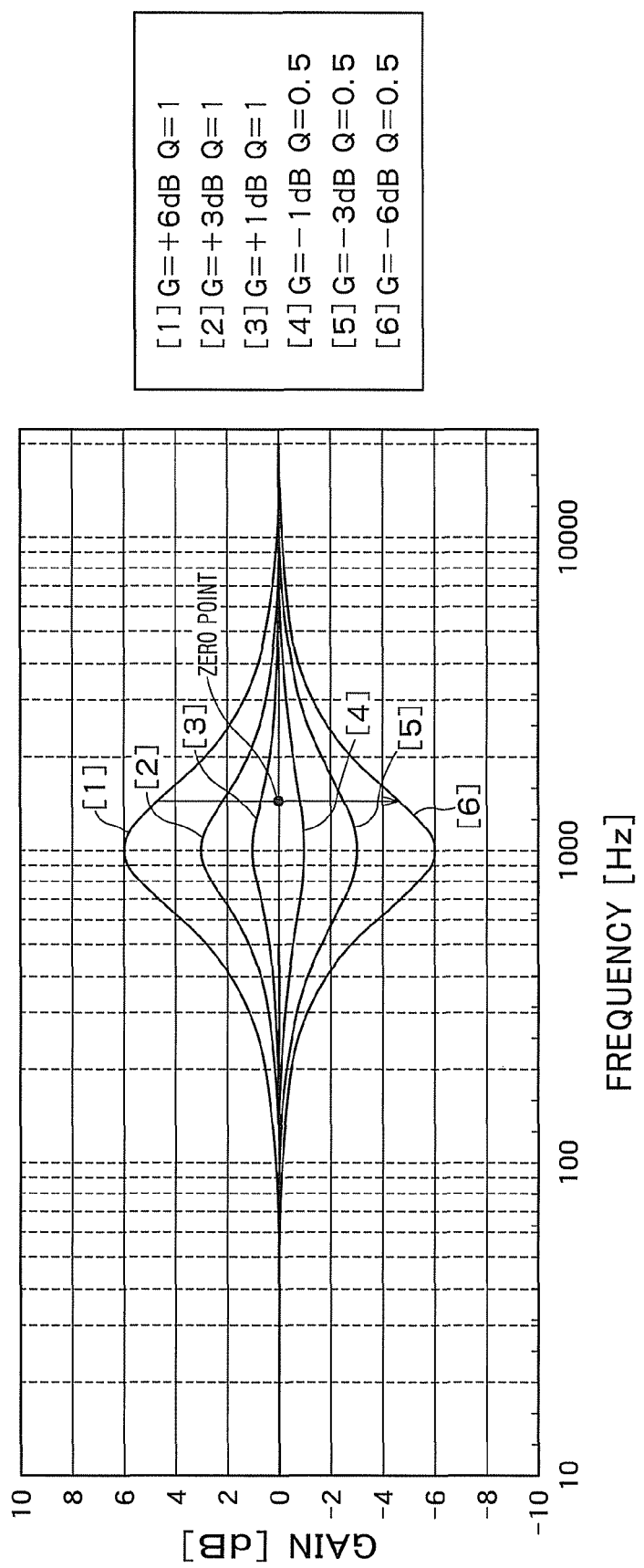
FIG. 3 shows output characteristics of the output digital signal of the digital filter device according to the first embodiment.

FIG. 3 shows output characteristics of the output digital signal of the digital filter device according to the first embodiment.

According to this embodiment, as described above, when changing the sign of the gain multiplier value, in a state where the gain multiplier value is equal to or close to zero, the filter coefficients of the IIR digital filter 3 are changed (the Q value is adjusted) so that the resulting output characteristic becomes approximately symmetrical to the original output characteristic with respect to the axis of 0 dB.

Thus, the resulting output characteristic can be made approximately symmetrical to the original output characteristic with respect to the axis of 0 dB while suppressing generation of noise (FIG. 3).

As described above, the digital filter device according to this embodiment can suppress the noise that can occur when changing the filter characteristic.

In this embodiment, a second order IIR digital filter has been described.

However, the present invention can be equally applied to a first order IIR digital filter or a third or higher order IIR digital filter.

Second Embodiment

In the first embodiment, there has been described a case where an IIR digital filter is used in the digital filter device.

In a second embodiment, there will be described a case where a FIR digital filter is used in a digital filter device.

Figure 4:
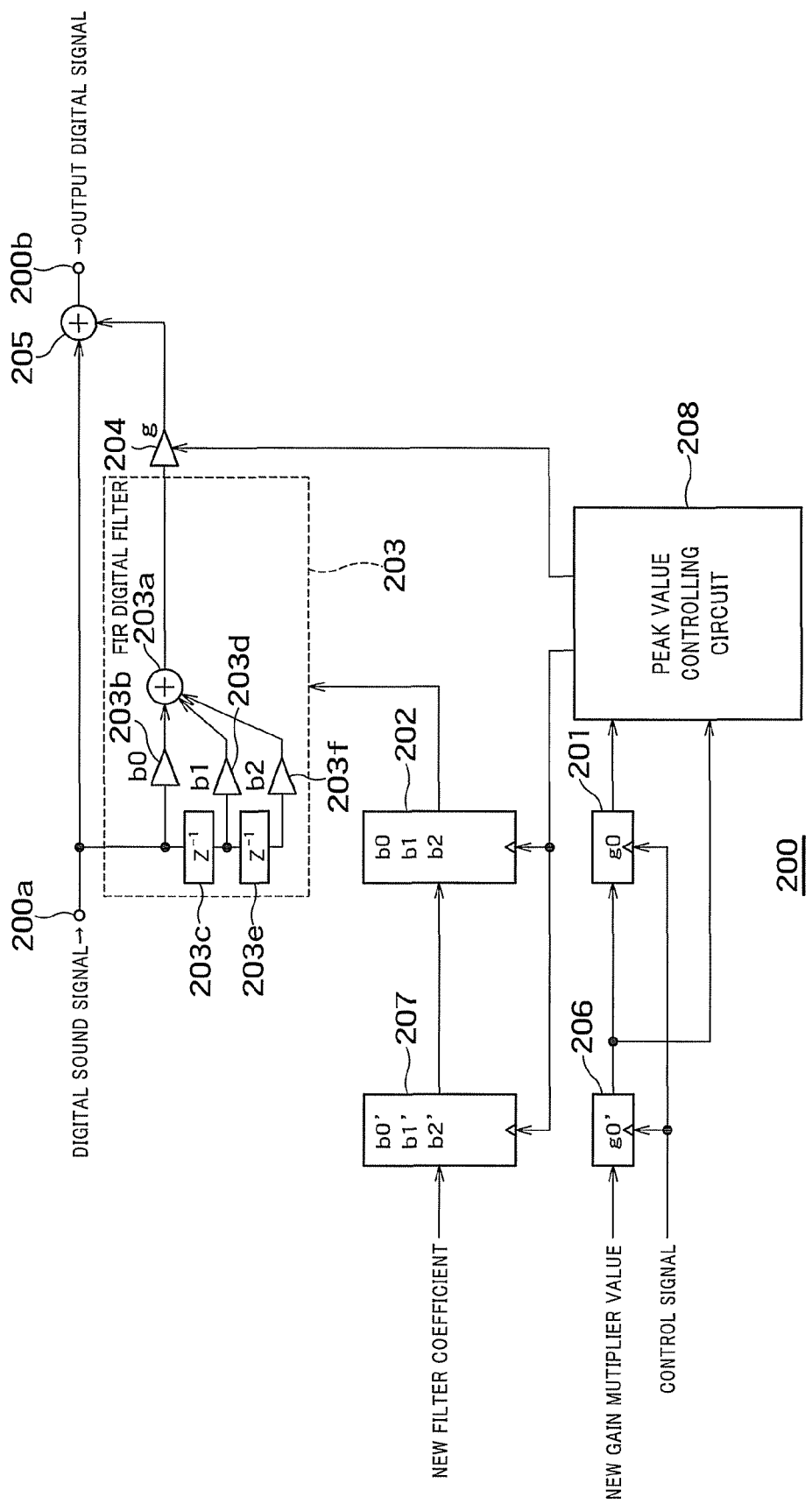
FIG. 4 is a block diagram showing a configuration of essential elements of a digital filter device 200 according to the second embodiment of the present invention, which is an aspect of the present invention.

FIG. 4 is a block diagram showing a configuration of essential elements of a digital filter device 200 according to the second embodiment of the present invention, which is an aspect of the present invention.

As shown in FIG. 4, the digital filter device 200 filters a digital sound signal input to an input terminal 200a and outputs an output digital signal from an output terminal 200b.

The digital filter device 200 has a first gain register 201 that stores a first gain multiplier value "g0" set for adjusting a gain characteristic of the output digital signal and a first coefficient register 202 that stores a plurality of filter coefficients "b0", "b1" and "b2" set for the gain multiplier value.

The digital filter device 200 further has a finite impulse response (FIR) digital filter 203 that filters the digital sound signal.

The FIR digital filter 203 has a first adder 203a that performs an arithmetic operation on signals and outputs the sum, and a first multiplier 203b that multiplies the digital sound signal input via the input terminal 200a by a coefficient "b0" corresponding to the filter coefficient "b0" stored in the first coefficient register 202 and outputs the product to the first adder 203a.

The FIR digital filter 203 further has a first delay circuit 203c that delays the digital sound signal input via the input terminal 200a and outputs the delayed signal, a second multiplier 203d that multiplies the signal output from the first delay circuit 203c by a coefficient "b1" corresponding to the filter coefficient "b1" stored in the first coefficient register 202 and outputs the product to the first adder 203a, a second delay circuit 203e that delays the signal output form the first delay circuit 203c and outputs the delayed signal, and a third multiplier 203f that multiplies the signal output from the second delay circuit 203e by a coefficient "b2" corresponding to the filter coefficient "b2" stored in the first coefficient register 202 and outputs the product to the first adder 203a.

In this way, the FIR digital filter 203 has a second order configuration.

The digital filter device 200 further has a gain multiplier 204 that multiplies the signal output from the first adder 203a by a gain multiplier value and a second adder 205 that adds the digital sound signal and the signal output from the gain multiplier 204 to each other and outputs the sum to the output terminal 200b as the output digital signal.

The digital filter device 200 further has a second gain register 206 that stores a newly set second gain multiplier value "g0'", and a second coefficient register 207 that stores a plurality of new filter coefficients "b0'", "b1'" and "b2'" set for the second gain multiplier value "g0'".

The digital filter device 200 further has a peak value controlling circuit 208 that controls the first coefficient register 202 and the second coefficient register 207 and adjusts the peak value of the output digital signal by shifting a gain multiplier value "g" applied to the gain multiplier 204 from the first gain multiplier value "g0" to the second gain multiplier value "g0'".

The digital filter device 200 configured as described above operates in the same way as in the first embodiment. That is, the filter coefficients of the FIR digital filter 203 are changed in a state where the gain multiplier value is equal to or close to zero, and therefore, noise that can occur when the filter coefficients are changed can be reduced.

As described above, as with the first embodiment, the digital filter device according to this embodiment can suppress the noise that can occur when changing the filter characteristic.

In this embodiment, a second order FIR digital filter has been described.

However, the present invention can be equally applied to a first order FIR digital filter or a third or higher order FIR digital filter.

What is claimed is:

1. A digital filter device that filters a digital sound signal input to an input terminal and outputs an output digital signal from an output terminal, comprising:
   a first gain register stores a first gain multiplier value set for adjusting a gain characteristic of said output digital signal;
   a first coefficient register stores a plurality of filter coefficients set for said gain multiplier value;
   an IIR digital filter has at least a first adder that performs an arithmetic operation on signals and outputs the sum, a first multiplier that multiplies said digital sound signal input via said input terminal by a coefficient corresponding to a filter coefficient stored in said first coefficient register and outputs the product to said first adder, a first delay circuit that delays said digital sound signal input via said input terminal and outputs the delayed signal, a second multiplier that multiplies the signal output from said first delay circuit by a coefficient corresponding to a filter coefficient stored in said first coefficient register and outputs the product to said first adder, a second delay circuit that delays the output signal of the first adder and outputs the delayed signal, and a third multiplier that multiplies the signal output from said second delay circuit by a coefficient corresponding to a filter coefficient stored in said first coefficient register and outputs the product to said first adder;
   a gain multiplier multiples the signal output from said first adder by a gain multiplier value;
   a second adder adds said digital sound signal and the signal output from said gain multiplier and outputs the sum to said output terminal;
   a second gain register stores a newly set second gain multiplier value;
   a second coefficient register stores a plurality of new filter coefficients set for said second gain multiplier value; and
   a peak value controlling circuit controls said first coefficient register and said second coefficient register and adjusts a peak value of said output digital signal by shifting said gain multiplier value applied to said gain multiplier from said first gain multiplier value to said second gain multiplier value,
   wherein said peak value controlling circuit
   compares said first gain multiplier value and said second gain multiplier value with each other, and
   replaces said filter coefficients stored in said first coefficient register with said new filter coefficients stored in said second coefficient register at a timing when the gain multiplier value applied to said gain multiplier becomes zero or becomes closest to zero for the first time during shifting the gain multiplier value from said first gain multiplier value to said second gain multiplier value if said first gain multiplier value and said second gain multiplier value are different in sign.

2. The digital filter device according to claim 1, wherein said peak value controlling circuit
   compares said first gain multiplier value and said second gain multiplier value with each other, and
   replaces said filter coefficients stored in said first coefficient register with said new filter coefficients stored in said second coefficient register at a timing when one of said first gain multiplier value and said second gain multiplier value that is closer to zero is applied to said gain multiplier if said first gain multiplier value and said second gain multiplier value have the same sign.

3. The digital filter device according to claim 1, wherein said filter coefficients are selected in such a manner that said IIR digital filter functions as a peaking filter.

4. The digital filter device according to claim 2, wherein said filter coefficients are selected in such a manner that said IIR digital filter functions as a peaking filter.

5. The digital filter device according to claim 1, wherein said filter coefficients are selected in such a manner that said IIR digital filter functions as a notch filter.

6. The digital filter device according to claim 2, wherein said filter coefficients are selected in such a manner that said IIR digital filter functions as a notch filter.

7. The digital filter device according to claim 1, wherein said filter coefficients are selected in such a manner that said IIR digital filter functions as a shelving filter.

8. The digital filter device according to claim 2, wherein said filter coefficients are selected in such a manner that said IIR digital filter functions as a shelving filter.

9. A digital filter device that filters a digital sound signal input to an input terminal and outputs an output digital signal from an output terminal, comprising:
   a first gain register stores a first gain multiplier value set for adjusting a gain characteristic of said output digital signal;
   a first coefficient register stores a plurality of filter coefficients set for said gain multiplier value;

an FIR digital filter has at least a first adder that performs an arithmetic operation on signals and outputs the sum, a first multiplier that multiplies said digital sound signal input via said input terminal by a coefficient corresponding to a filter coefficient stored in said first coefficient register and outputs the product to said first adder, a first delay circuit that delays said digital sound signal input via said input terminal and outputs the delayed signal, and a second multiplier that multiplies the signal output from said first delay circuit by a coefficient corresponding to a filter coefficient stored in said first coefficient register and outputs the product to said first adder;

a gain multiplier multiples the signal output from said first adder by a gain multiplier value;

a second adder adds said digital sound signal and the signal output from said gain multiplier and outputs the sum to said output terminal;

a second gain register stores a newly set second gain multiplier value;

a second coefficient register stores a plurality of new filter coefficients set for said second gain multiplier value; and a peak value controlling circuit controls said first coefficient register and said second coefficient register and adjusts a peak value of said output digital signal by shifting said gain multiplier value applied to said gain multiplier from said first gain multiplier value to said second gain multiplier value, wherein said peak value controlling circuit compares said first gain multiplier value and said second gain multiplier value with each other, and replaces said filter coefficients stored in said first coefficient register with said new filter coefficients stored in said second coefficient register at a timing when the gain multiplier value applied to said gain multiplier becomes zero or becomes closest to zero for the first time during shifting the gain multiplier value from said first gain multiplier value to said second gain multiplier value if said first gain multiplier value and said second gain multiplier value are different in sign.

10. The digital filter device according to claim 9, wherein said peak value controlling circuit compares said first gain multiplier value and said second gain multiplier value with each other, and replaces said filter coefficients stored in said first coefficient register with said new filter coefficients stored in said second coefficient register at a timing when one of said first gain multiplier value and said second gain multiplier value that is closer to zero is applied to said gain multiplier if said first gain multiplier value and said second gain multiplier value have the same sign.

* * * * *